United States Patent [19]

Doan et al.

[11] Patent Number: 5,206,187
[45] Date of Patent: Apr. 27, 1993

[54] METHOD OF PROCESSING SEMICONDUCTOR WAFERS USING A CONTACT ETCH STOP

[75] Inventors: Trung T. Doan, Boise; Gurtej S. Sandhu, both of Boise, Id.

[73] Assignee: Micron Technology, Inc., Boise, Id.

[21] Appl. No.: 812,063

[22] Filed: Dec. 17, 1991

Related U.S. Application Data

[63] Continuation-in-part of Ser. No. 753,356, Aug. 30, 1991, abandoned.

[51] Int. Cl.$^5$ .................. H01L 21/283; H01L 21/311
[52] U.S. Cl. .................................. 437/192; 437/195; 437/200; 437/228; 437/41; 156/656; 156/657; 148/DIG. 19
[58] Field of Search ............... 437/192, 200, 201, 228, 437/194, 195, 41; 148/DIG. 19, DIG. 147; 357/675, 715; 156/656, 657

[56] References Cited

U.S. PATENT DOCUMENTS

| | | | |
|---|---|---|---|
| 4,593,454 | 6/1986 | Baudrant et al. | |
| 4,657,628 | 4/1987 | Holloway et al. | 156/643 |
| 4,665,608 | 5/1987 | Okamoto et al. | 148/DIG. 47 |
| 4,767,724 | 8/1988 | Kim et al. | 437/194 |
| 4,795,722 | 1/1989 | Welch et al. | 437/200 |
| 4,881,105 | 11/1989 | Davari et al. | 357/23.4 |
| 5,022,958 | 6/1991 | Favreau et al. | 437/228 |
| 5,026,666 | 6/1991 | Hills et al. | 437/195 |

OTHER PUBLICATIONS

"Selective Oxidation of Titanium While Forming . . . ", IBM Tech. Disc. Bull., vol. 27, No. 10A, Mar. 1985, pp. 5870–5875.

*Primary Examiner*—T. N. Quach
*Attorney, Agent, or Firm*—Wells, St. John, Roberts, Gregory & Matkin

[57] ABSTRACT

A method of processing a semiconductor wafer comprises: a) fabricating a wafer to define a plurality of conductively doped active regions, the active regions having outwardly exposed surfaces positioned at varying elevations of the wafer; b) providing a layer of transition metal oxide elevationally above the active regions; c) applying an insulating dielectric layer elevationally above the transition metal oxide layer; d) etching selected portions of the insulating dielectric layer over different elevation active areas using an etch chemistry which is highly selective to the transition metal oxide and using the transition metal oxide as an effective etch stop enabling etching of the insulating dielectric layer in a single etch step to adjacent selected active regions which are at different elevations; and e) etching the transition metal oxide from the selected portions and upwardly exposing selected active regions.

36 Claims, 6 Drawing Sheets

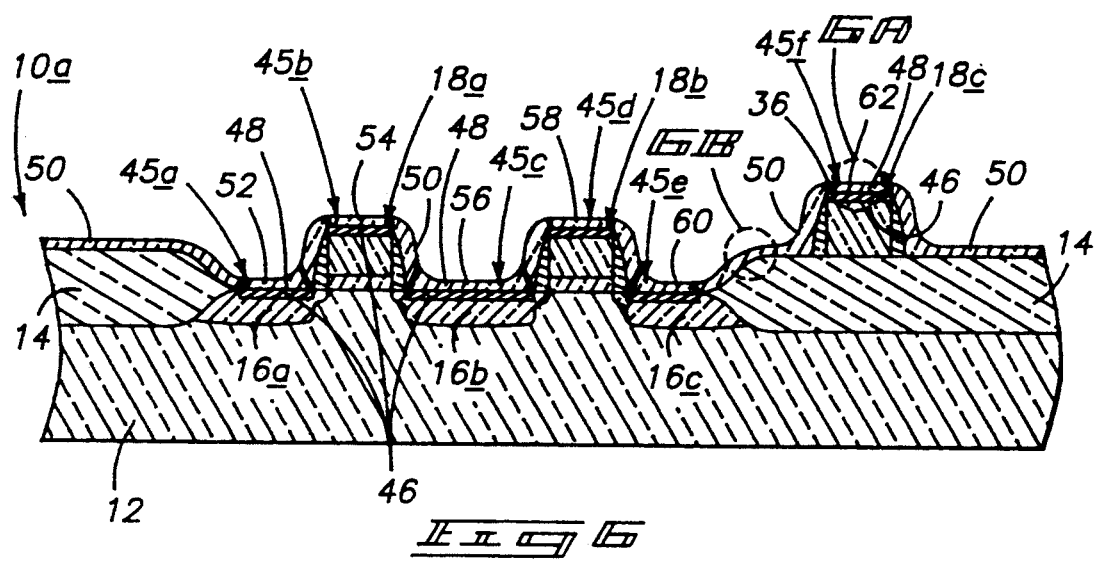
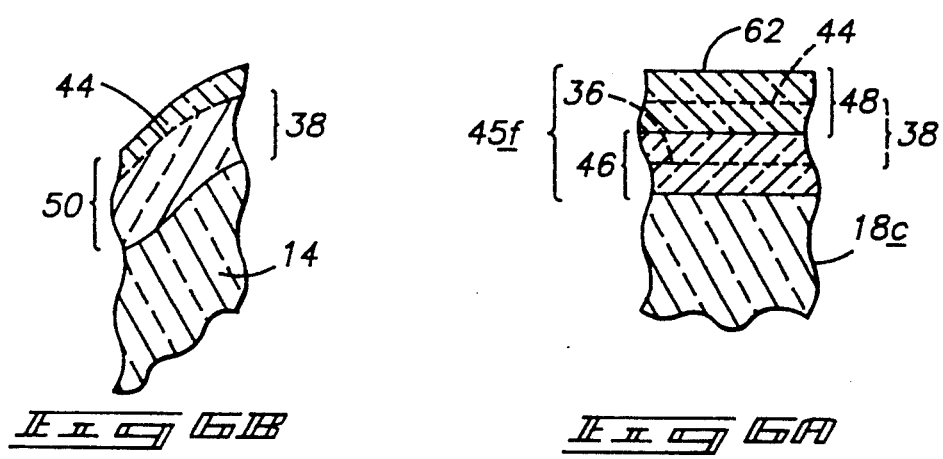
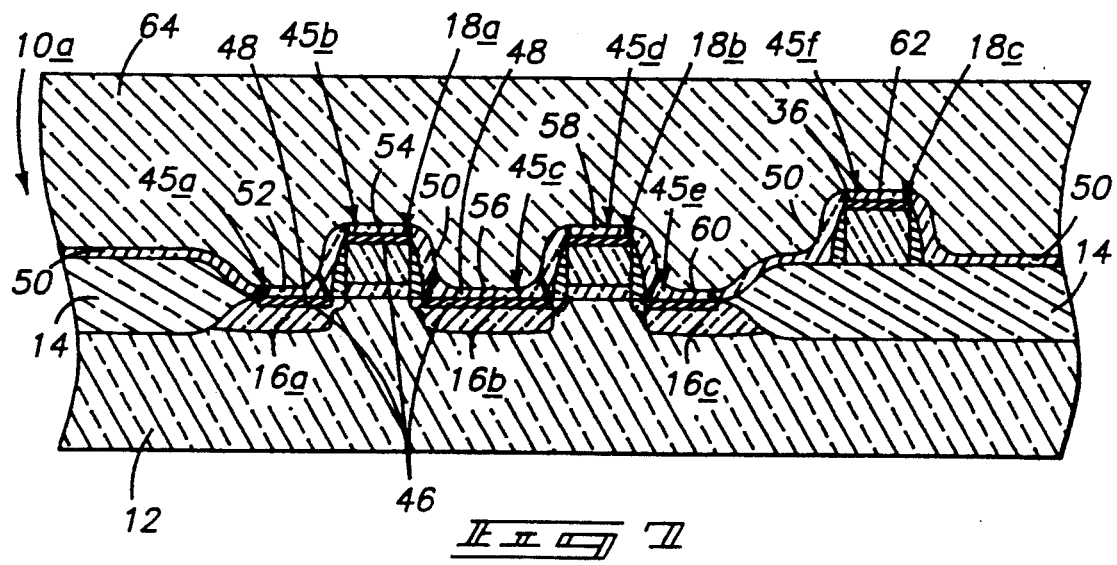

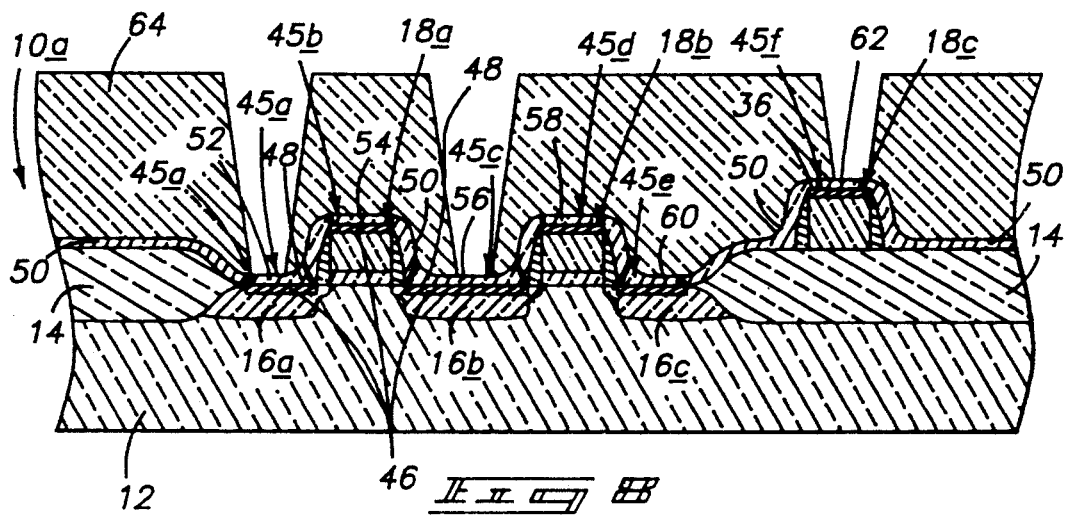
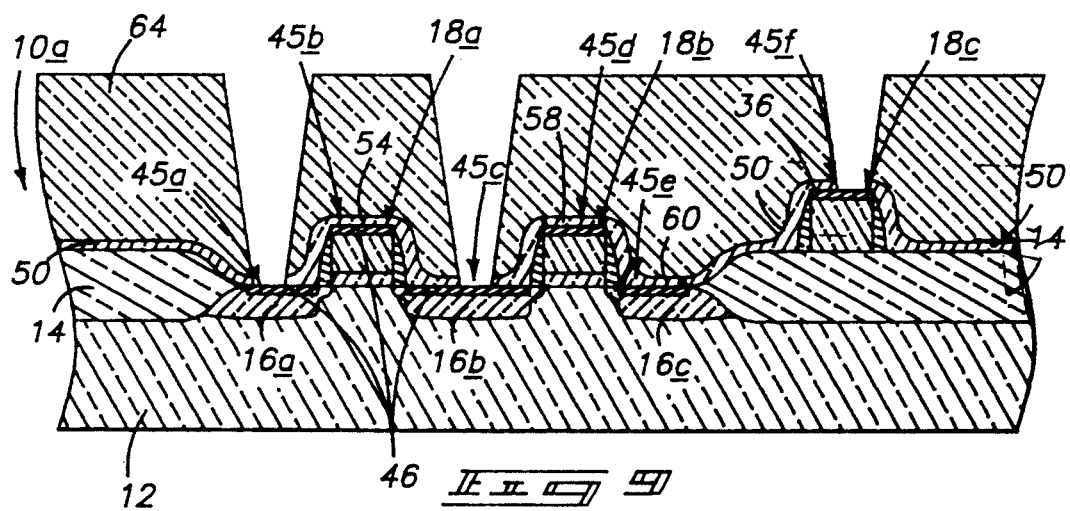
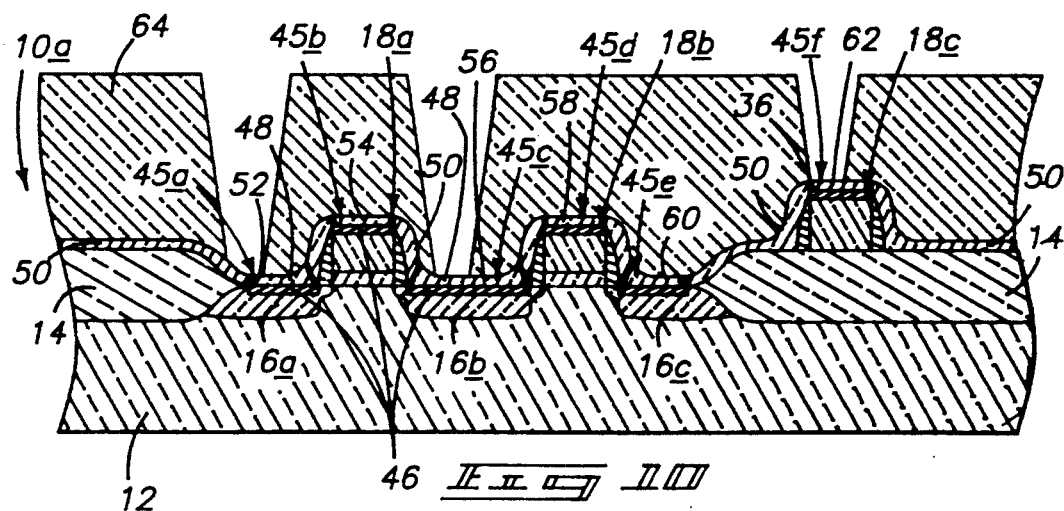

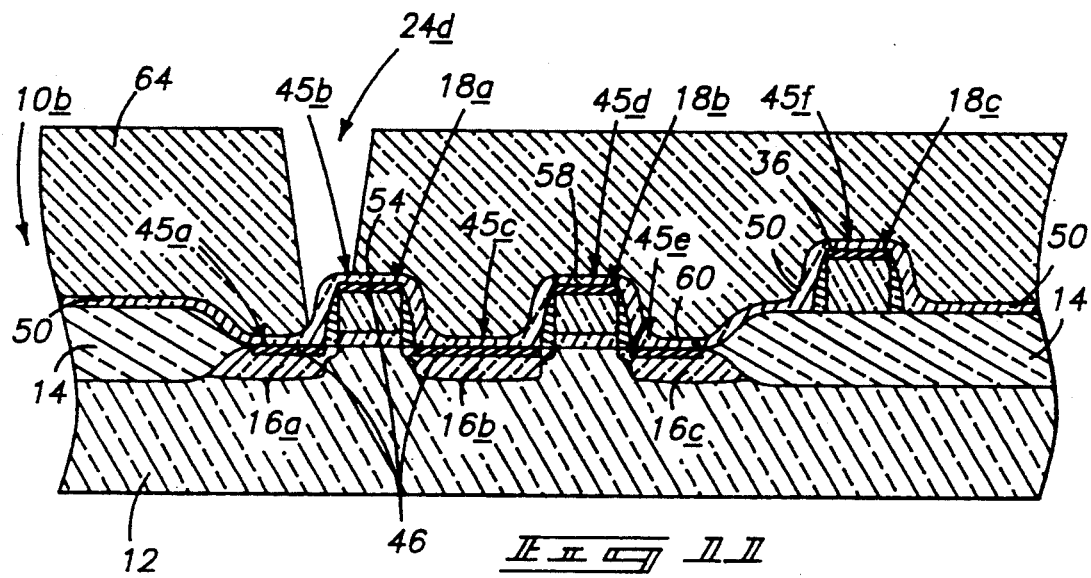
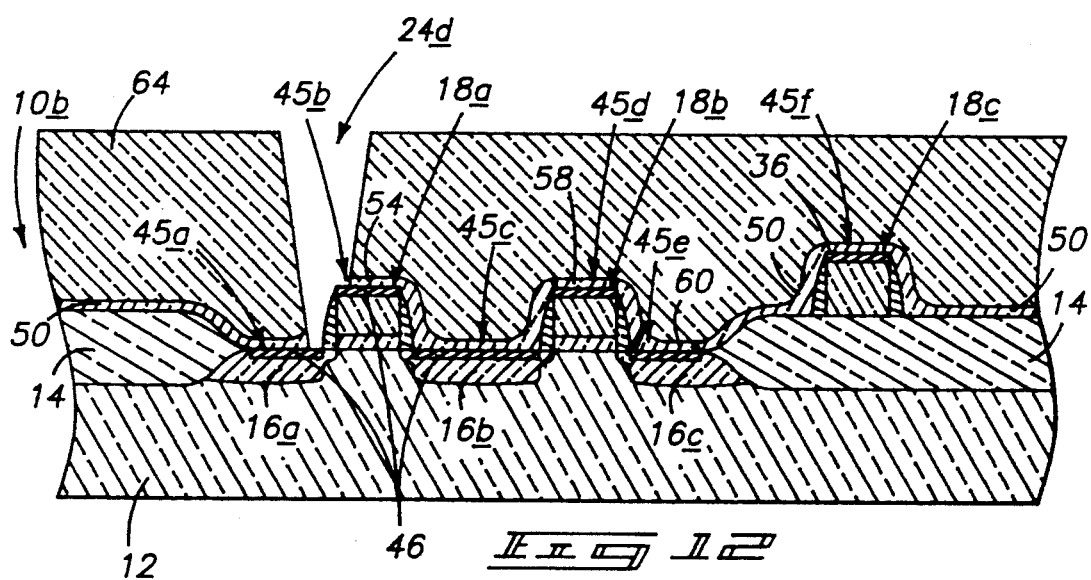
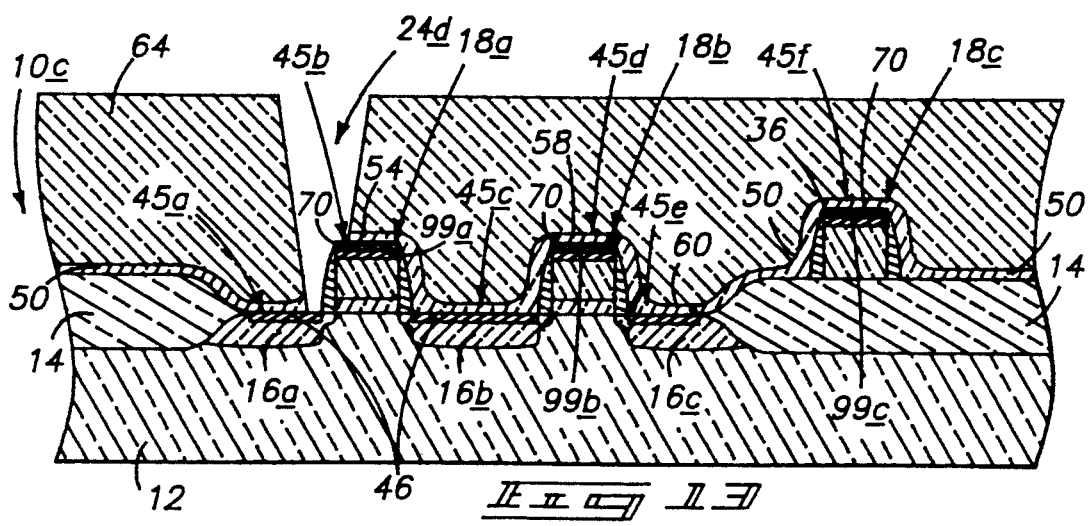

METHOD OF PROCESSING SEMICONDUCTOR WAFERS USING A CONTACT ETCH STOP

RELATED PATENT APPLICATION DATA

This patent resulted from a continuation-in-part application of U.S. patent application Ser. No. 07/753,356 filed on Aug. 30, 1991 entitled "Method of Processing Semiconductor Wafers Using A Self-Aligned Contact Etch Stop". The 07/753,356 application was abandoned.

TECHNICAL FIELD

This invention relates generally to semiconductor wafer processing, and more particularly to etching of contact openings through insulating dielectric layers to contacts on a wafer which are positioned at varying elevations.

BACKGROUND OF THE INVENTION

There is a continual goal in semiconductor wafer processing to maximize circuit density thereby minimizing the finished size of the semiconductor chip. One of the ways of minimizing the amount of surface area utilized for a given integrated circuit is to project the various devices and circuitry into the wafer, which is commonly known as vertical integration. As circuit complexity increases and vertical integration becomes more complex, the wafer topography becomes more and more varied. Differences in elevation might be as much as 50 to 100 percent or more across the die which can lead to severe problems in under-etching and over-etching of desired contacts. This gives rise to a need to etch contact/via openings of a given layer in multiple process steps because of a large variation in depth of the desired contacts at different points on the wafer.

The problem is diagrammatically illustrated by FIGS. 1 and 2. Referring to FIG. 1, a semiconductor wafer 10 includes a bulk substrate 12, field oxide regions 14, conductively doped silicon containing active regions 16a, 16b and 16c, and conductive runners 18a, 18b and 18c. The runners 18 are surrounded about their sides with spacer insulating material 20, which is typically oxide. A layer 22 of planarized dielectric oxide provides the top layer of the wafer. The goal or intent in the example is to etch contact openings to the upper surface of regions 16a, 16b and runner 18c. However, the elevation within dielectric layer 22 of the upper surface of runner 18c differs significantly from the elevation of the upper surfaces of regions 16a and 16b.

The problem during etch is illustrated by FIG. 2. Contact opening/vias 24a, 24b and 24c are illustrated as having been started within dielectric layer 22 over regions 16a, 16b and runner 18c, respectively. Opening 24c is illustrated as having been etched to the depth of the upper surface of runner 18c. However, further etching within dielectric layer 22 must occur for openings 24a and 24b to continue downwardly to the upper surfaces of regions 16a, 16b. During such continued etching, region 18c can be over etched, causing damage or destruction of runner 18c.

Typically, runner 18c will comprise polysilicon whereas dielectric layer 22 will be principally composed of SiO$_2$. Etch chemistries are preferably selected such that a greater amount of SiO$_2$ is removed during the etch than is polysilicon at the point where the etch reaches contact 18c. Nevertheless, etch of exposed material of runner 18c while etch of openings 24a and 24b continues can be significant, resulting in damage or circuit failure.

The typical present way of overcoming this drawback is to conduct the photomasking and etch of openings 24a and 24b separately from the etch for opening 24c. Such multiple steps for contact etch reduce throughput time, and correspondingly increase costs of the overall process.

Another problem associated with contact etch concerns misalignment of the photomask. Electronic device dimensions in semiconductor processing have shrunk to the level of mask misalignment tolerances. FIG. 3 illustrates the same prior art wafer of FIG. 1, but here a mask for producing the contact opening 24a has been misaligned such that opening 24a overlaps with a field oxide region 14, as shown. This causes field oxide to be etched through to the substrate which will result in a short between active area 16a and substrate 12 when metal fills the contact openings. This potential disastrous problem is typically overcome by increasing the available area of region 16a at those locations on the wafer where contacts are to be etched. However, this consumes valuable surface area of the wafer, and works against maximizing integration density.

It is an object of this invention to overcome these and other drawbacks associated with the prior art.

The present invention is particularly pointed out and distinctly claimed at the end of this specification. However, the structures and methods of operation of one or more preferred embodiments may best be understood by reference to the following description taken in connection with the accompanying drawings wherein like reference characters refer to like elements.

BRIEF DESCRIPTION OF THE DRAWINGS

FIG. 6 is a diagrammatic section of the FIG. 4 wafer illustrated at a processing step subsequent to that illustrated by FIG. 5.

FIG. 6A is an enlarged sectional view of the phantom circle 6A in FIG. 6.

FIG. 6B is an enlarged sectional view of the phantom circle 6B in FIG. 6.

FIG. 7 is a diagrammatic section of the FIG. 4 wafer illustrated at a processing step subsequent to that illustrated by FIG. 6.

FIG. 8 is a diagrammatic section of the FIG. 4 wafer illustrated at a processing step subsequent to that illustrated by FIG. 7.

FIG. 9 is a diagrammatic section of the FIG. 4 wafer illustrated at a processing step subsequent to that illustrated by FIG. 8.

FIG. 10 is a diagrammatic section of the FIG. 7 wafer illustrating self-alignment aspects of the invention where mask misalignment occurs.

FIG. 11 is a diagrammatic section of an alternate wafer.

FIG. 12 is a diagrammatic section of the FIG. 11 wafer illustrated at a processing step subsequent to that illustrated by FIG. 11.

FIG. 13 is a diagrammatic section of yet another alternate wafer.

DETAILED DESCRIPTION OF THE PREFERRED EMBODIMENTS

Figure 1:
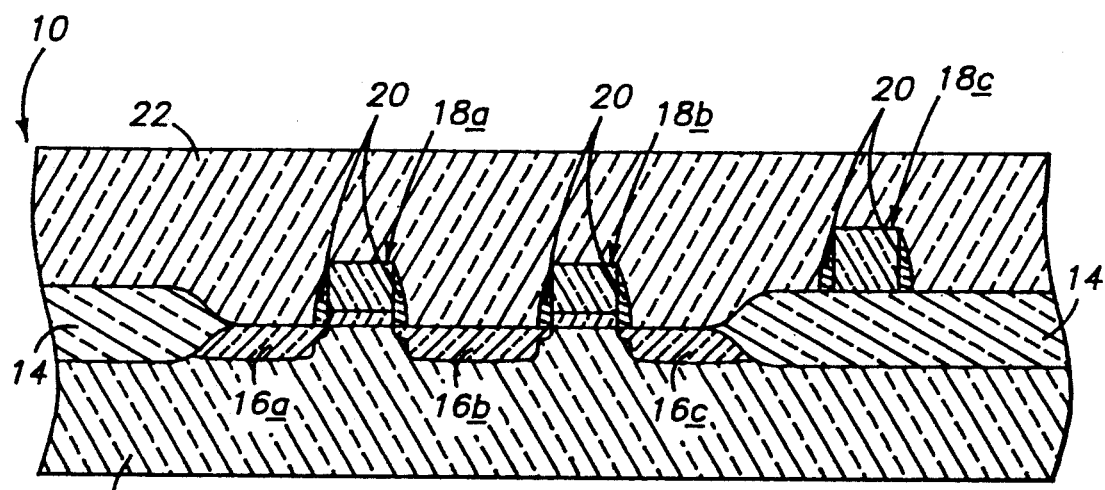
FIG. 1 is a diagrammatic cross-sectional view of a prior art wafer and is discussed in the Background section above.
Figure 2:
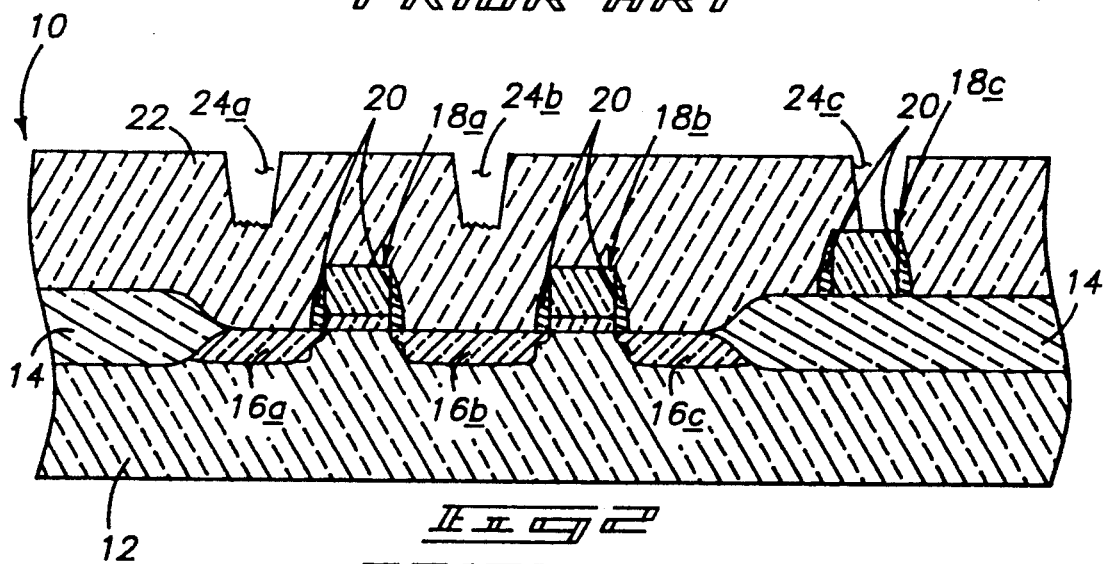
FIG. 2 is diagrammatic section of the FIG. 1 wafer at a processing step subsequent to that illustrated by FIG. 1.

This disclosure of the invention is submitted in furtherance of the constitutional purposes of the U.S. Patent Laws "to promote the progress of science and useful arts" (Article 1, Section 8).

In accordance with one aspect of the invention, a method of processing a semiconductor wafer comprises the following steps:

fabricating a wafer to define a plurality of conductively doped active regions, the active regions having outwardly exposed surfaces positioned at varying elevations on the wafer;

providing a layer of transition metal oxide elevationally above the active regions;

applying an insulating dielectric layer elevationally above the transition metal oxide layer;

etching selected portions of the insulating dielectric layer over different elevation active areas using an etch chemistry which is highly selective to the transition metal oxide and using the transition metal oxide as an effective etch stop enabling etching of the insulating dielectric layer in a single etch step to adjacent selected active regions which are at different elevations; and etching the transition metal oxide from the selected portions and upwardly exposing selected active regions.

In accordance with another aspect of the invention, a method of processing a semiconductor wafer comprises the following steps:

fabricating a wafer to define a plurality of conductively doped silicon containing active regions, the active regions having outwardly exposed surfaces positioned at varying elevations on the wafer;

converting the outwardly exposed surfaces of the active regions into a barrier transition metal silicide which connects with the active regions;

providing a layer of transition metal oxide over the barrier transition metal silicide of the active regions thereby producing sandwich regions of outer transition metal oxide regions and adjacent transition metal silicide in contact with the active regions; the outer transition metal oxide regions of the sandwich regions having outer surfaces positioned at varying elevations on the wafer;

applying an insulating dielectric layer atop the wafer;

selectively etching the insulating dielectric layer over selected portions of different elevation sandwich regions using an etch chemistry which is highly selective to the transition metal oxide and using the transition metal oxide as an effective etch stop in etching of the insulating dielectric layer in a single etch step to adjacent selected active regions which are at different elevations; and etching the transition metal oxide from the selected portions of outer transition metal sandwich regions.

The preferred method for converting the outwardly exposed surfaces of the active regions into a barrier transition metal silicide and providing a layer of transition metal oxide over the barrier transition metal silicide comprises:

depositing a layer of transition metal atop the wafer which contacts the surfaces of the active regions and other areas on the wafer; the transition metal layer having a thickness, an outer region and an inner region; and processing the wafer under conditions which reacts a) the transition metal of the inner region over the silicon containing active regions with such silicon to produce a transition metal silicide, and b) the transition metal of the outer region to form a transition metal oxide thereby transforming the outer region over the other areas into transition metal oxide and the transition metal over the silicon containing active regions into sandwich regions of outer transition metal oxide and adjacent transition metal silicide in contact with the active regions.

Example preferred transition metals include Ti, Mo, Ta, Co, Pt, Pd, Ni and W. Ti is most preferred. In the context of this document, "transition metal" means an elemental transition metal or an alloy including elemental transition metals. Preferably, the transition metal is applied to a thickness of from about 200 Angstroms to about 600 Angstroms, with 300 Angstroms being most preferred. The preferred conditions for simultaneously reacting the transition metal to form oxide and silicide is heating the wafer in an oxidizing atmosphere containing an effective oxidizing amount of oxygen. The preferred method of heating is by rapid thermal processing. The preferred thickness of the resultant transition metal oxide layer is from about 200 Angstroms to about 4000 Angstroms.

Figure 4:
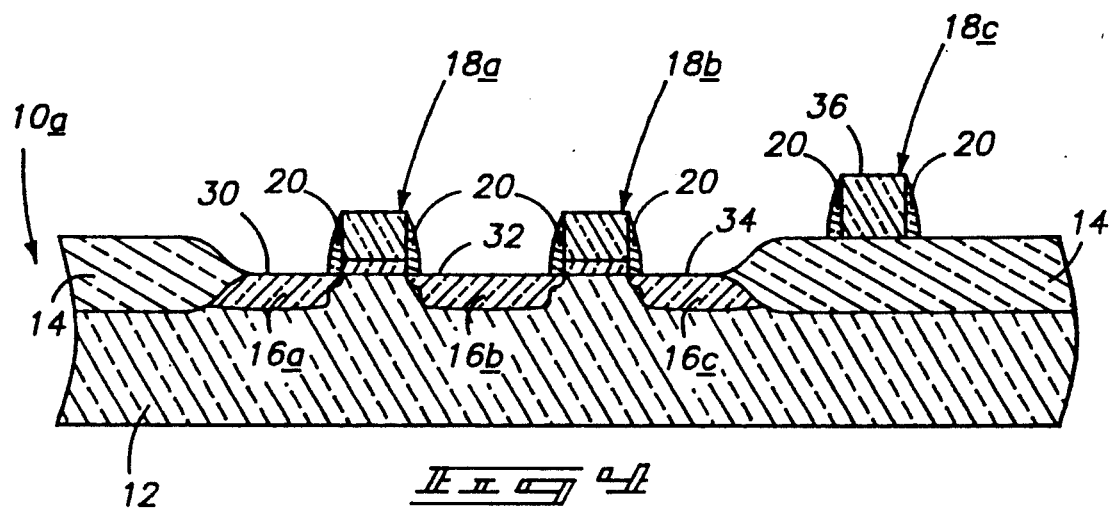
FIG. 4 is a diagrammatic section of a semiconductor wafer processed in accordance with the invention.

The discussion proceeds first with reference to FIGS. 4-9 with a description of one preferred embodiment. FIG. 4 illustrates the FIG. 1 wafer, now designated as wafer 10a, after formation of field oxide regions 14, active regions 16a, 16b and 16c, runners 18a, 18b and 18c, and spacer insulating oxide 20. For purposes of the continuing discussion, regions 16a, 16b, 16c and runner 18c define a plurality of conductively doped silicon containing active regions having outwardly exposed surfaces 30, 32, 34 and 36, respectively. Surface 36 is at an elevationally different or varied region from that of surfaces 30, 32, and 34 which are essentially at the same elevation.

Figure 5:
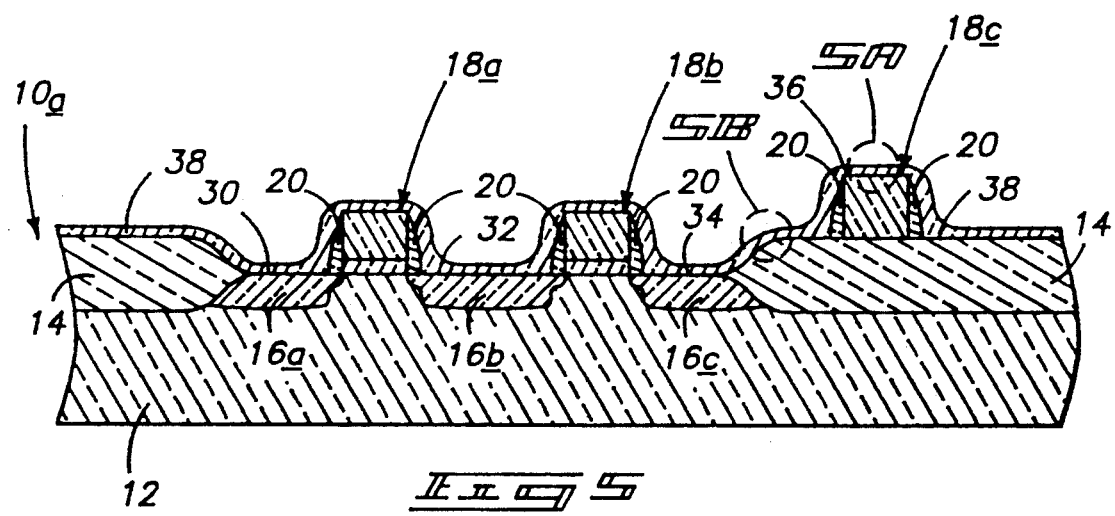
FIG. 5 is a diagrammatic section of the FIG. 4 wafer illustrated at a processing step subsequent to that illustrated by FIG. 5.
Figure 5B:
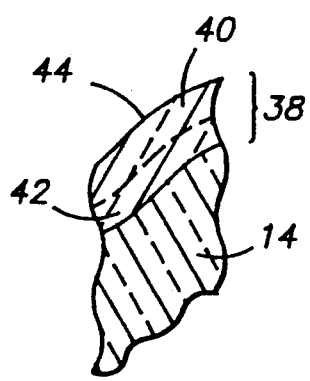
FIG. 5B is an enlarged sectional view of the phantom circle 5B in FIG. 5.
Figure 5A:
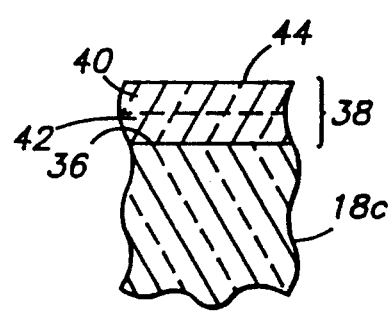
FIG. 5A is an enlarged sectional view of the phantom circle 5A in FIG. 5.

Referring to FIG. 5, a layer 38 of elemental titanium metal is conformally applied atop the wafer and contacts the exposed surfaces 30, 32, 34 and 36 as well as all other areas on the wafer. In a specific example, titanium layer 38 was applied to a thickness of approximately 300 Angstroms. For purposes of the continuing discussion, titanium layer 38 has an outer region 40 and an inner region 42. (FIGS. 5A and 5B). Outer region 40 and inner region 42 are illustrated as being of the same thickness dimension for purpose of the continuing discussion with reference to a specific example, although such is not required. FIGS. 5A and 5B illustrate outer region 40 as having an uppermost surface 44.

Referring to FIGS. 6, 6A and 6B, wafer 10a is processed to react the titanium of region 42 (FIGS. 5A and 5B) over silicon containing active regions with such silicon to produce $TiSi_x$, and react the outer regions 40 into $TiO_y$. The "y" of $TiO_y$ is expected to range from 1.0 to 2.0, with "y" being predominantly "2", and the "x" of $TiSi_x$ is expected to range from 1.0 to 2.5, with "x" predominately being 2. This transforms the titanium over the silicon containing active regions into sandwich regions 45a, 45b, 45c, 45d, 45e and 45f, each having an outer $TiO_y$ region 48 and an adjacent inner $TiSi_x$ region 46 which is in contact with the underlying respective active region. In the described example, a wafer containing a 300 Angstrom layer of titanium was reacted under rapid thermal processing (RTP) conditions of 900° C. for 60 seconds with 4500 sccm $O_2$ flow at 1 atmosphere of pressure converting into 600 Angstroms of $TiO_y$ when Ti is on $SiO_2$, and 300 Angstroms of $TiO_y$ and 300 Angstroms of $TiSi_x$ when Ti is atop Si.

Typical reactant conditions are expected to react approximately the upper half of titanium layer 38 (region 40 in FIG. 5A) to produce $TiO_y$ with the remaining inner or lower half of layer 38 (inner region 42 in FIG. 5A) to produce $TiSi_x$ with the underlying active regions. The other areas on the wafer where Ti does not cover silicon will be transformed into regions 50 of $TiO_y$. During such processing, the reaction of titanium with oxygen and silicon results in regions 45 and 50 enlarging somewhat from the original thickness of titanium layer 38. Outer $TiO_y$ regions 48 have outer surfaces 52, 54, 56, 58, 60 and 62 occurring at different or varying elevations on the wafer and planarized.

The $TiSi_x$ functions to reduce contact resistance between a subsequently applied conductive layer and active regions to which electrical contact is to be made. Note that silicon from the substrate and runners 18a, 18b and 18c is consumed in the process.

Referring to FIG. 7, an insulating dielectric layer 64, typically BPSG, is applied atop the wafer. Such would typically be deposited to a thickness of from 1 micron to 2 microns.

Referring to FIG. 8, insulating dielectric layer 64 is patterned and etched over selected portions of different elevation sandwich regions, such as illustrated regions 45a, 45c and 45f, with a chemistry that is highly selective to $TiO_y$. Thereby, $TiO_x$ is used as an effective etch stop enabling etching of insulating dielectric 64 in a single etch step to selected portions of the outer $TiO_y$ sandwich regions which are at different elevations on the wafer. This enables etching of insulating dielectric 64 in a single etch step to immediately adjacent active regions which are at different elevations within the wafer. An example plasma etch chemistry that would etch BPSG at a ratio of approximately 25:1 with respect to $TiO_y$ is 35 sccm $CHF_3$, 60 sccm Ar, and 25 sccm $CF_4$, at a power of 700 watts.

Referring to FIG. 9, $TiO_y$ is thereafter etched from selected portions of outer regions 48 of sandwich regions 45a, 45c and 45f. An example etch chemistry which will selectively etch $TiO_y$ relative to the underlying $TiSi_x$ and to $SiO_2$ is a solution of pure $NH_4OH$. Also usable would be a solution of $H_2SO_4$ at a 20:1 ratio of $H_2O$ to $H_2SO_4$ by volume, or boiling concentrated $H_2SO_4$.

Figure 3:
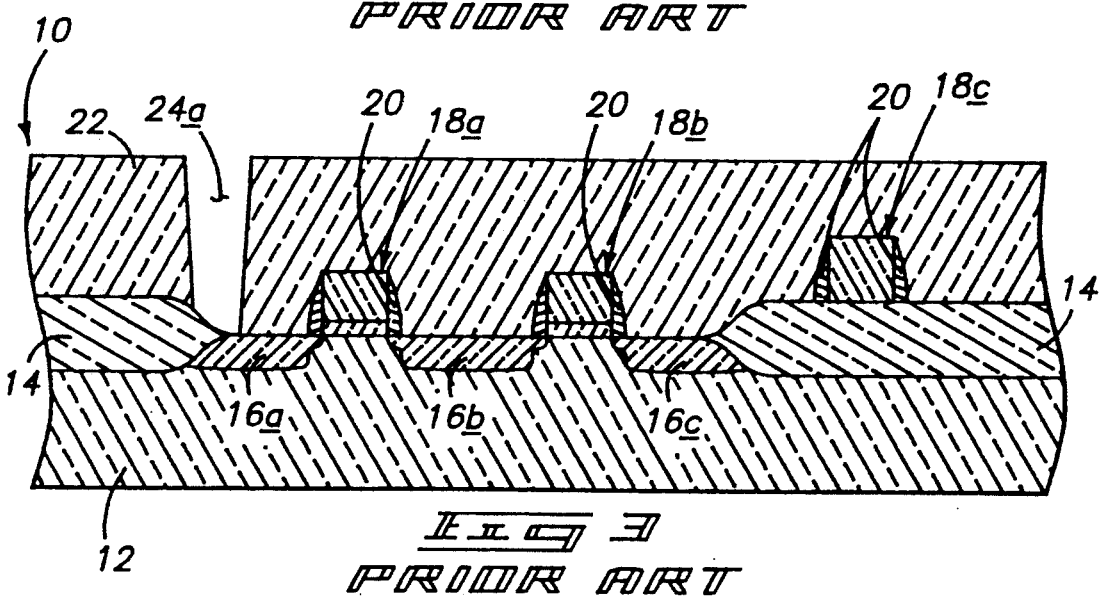
FIG. 3 is a diagrammatic section of the FIG. 1 wafer at an alternate processing step subsequent to that illustrated by FIG. 1.

The $TiO_y$ etch stop of the above described embodiment provides a self-aligning advantage which minimizes the impact of mask misalignment, as is illustrated by FIG. 10. Planarized layer 64 is illustrated in FIG. 10 as having been subjected to a mask misalignment which displaces the contact openings/vias to the left from their intended positions, which places the left-most contact over a field oxide region 14. However, the $TiO_y$ overlying the field oxide region 14 as well as the $TiO_y$ layer 50 overlying other layers of the wafer, prevents etching of such field oxide to prevent the prior art substrate to active region short of FIG. 3. The $TiO_y$ is then etched selectively relative to the underlying silicide and $SiO_2$ regions, using for example either of the etch chemistries described above for such purpose. Accordingly, the method provides "self-alignment" with respect to the field oxide in that over etching does not occur where there has been misalignment.

The above described technique provides an effective way to etch contact/vias having various depths and protects the material at the base of the contacts from further etching. Such saves a mask step which is otherwise needed to effectively etch contacts at varying depths or elevation within a substrate. The self-aligning aspect of the invention with respect to field oxide enables more lenient design rules for the process. Note also that utilizing a thin layer of $TiO_y$ in accordance with the invention helps in clearing the contacts faster after the contact etch.

Alternate methods to that described above could of course be employed. By way of example only, the outwardly exposed surfaces of the active regions could be covered with a transition metal with the transition metal silicide being formed in a non-oxidizing atmosphere. The metal could then be etched selectively relative to Si and $SiO_2$. Thereafter, a layer of transition metal oxide could be directly deposited on the wafer and accordingly over the barrier transition metal silicide. This is but one additional example of how the transition metal silicide/transition metal oxide can be provided in accordance aspects of the invention.

The above described embodiment illustrates a self-aligning feature with respect to the field oxide, but not with respect to the illustrated runner/gates. Such is illustrated with reference to FIGS. 11 and 12. FIG. 11 illustrates a wafer 10b wherein a contact opening 24d has been misaligned to the right to the point where it overlaps both source/drain active region 16a and runner 18a. FIG. 12 illustrates the second etch having been conducted to remove the $TiO_y$ within contact opening 24d. Note from this point that when a conductive material is used to fill contact opening 24d, an undesirable runner/gate (18a) to active area (16a) short will occur.

A further enhancement of the invention rendering the process self-aligning with respect to both field oxide and the conductive runners is described with reference to FIG. 13. There illustrated is a wafer 10c that has been provided with a layer 70 of insulating dielectric atop of the runners 18a, 18b and 18c before deposition of the titanium or $TiO_y$. The selected insulating dielectric must be such that the $TiO_y$ is selectively etchable relative to it. A material of choice is $SiO_z$, where "z" ranges from 1.0 to 2.5 and is predominately 2. Described above are chemistries of $NH_4OH$ and $H_2SO_4$ which could be utilized for etching $TiO_y$ selectively relative to $SiO_z$. The $SiO_z$ would typically be provided to a thickness of at least 500 Angstroms. Such would preferably be provided after deposition of the polysilicon used to form runners 18a, 18b and 18c, and before patterning of runners 18a, 18b and 18c. Layer 70 would thereafter comprise a part of the patterned runners 18a, 18b and 18c. In the illustrated embodiment, runners 18a, 18b, and 18c have previously been provided with an upper layer 99a, 99b, and 99c respectively, of WSi$_x$ prior to patterning for increasing the overall runner conductivity, as is well known to people of skill in the art.

Figure 14:
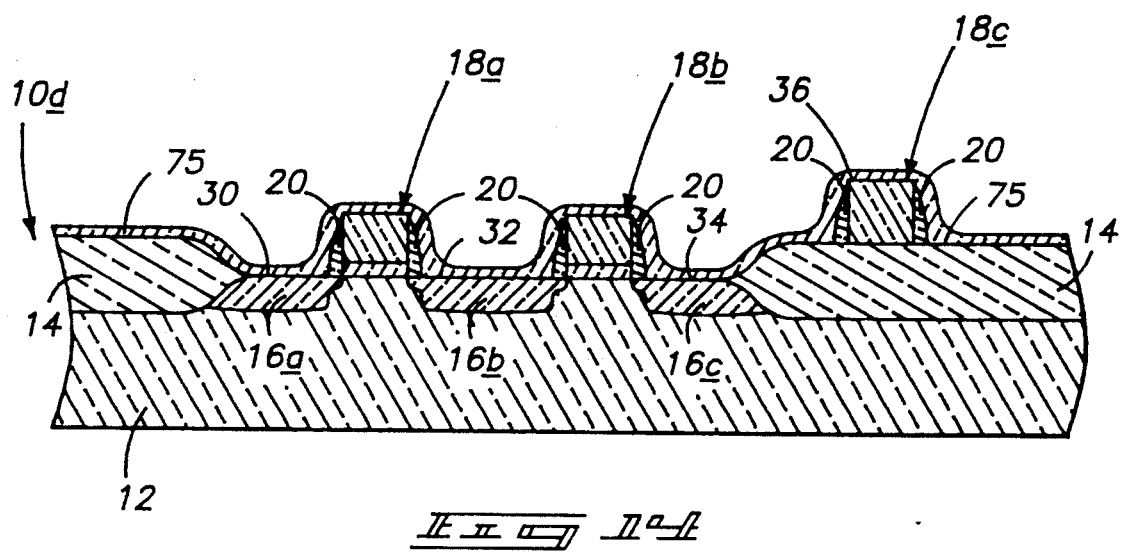
FIG. 14 is a diagrammatic section of still another alternate wafer.

In accordance with another aspect of the invention, a transition metal oxide is utilized as an etch stop apart from any formation of a silicide with the silicon area being contacted. An example of this aspect of the invention is described with reference to FIGS. 14 and 15. FIG. 14 illustrates a wafer 10d at a processing step subsequent to that illustrated by FIG. 4 with respect to the first described embodiment. From FIG. 4, a barrier layer 75 of insulting dielectric (such as the above described SiO$_2$) is deposited. Barrier layer 75 is preferably deposited to a thickness of at least 500 Angstroms.

Figure 15:
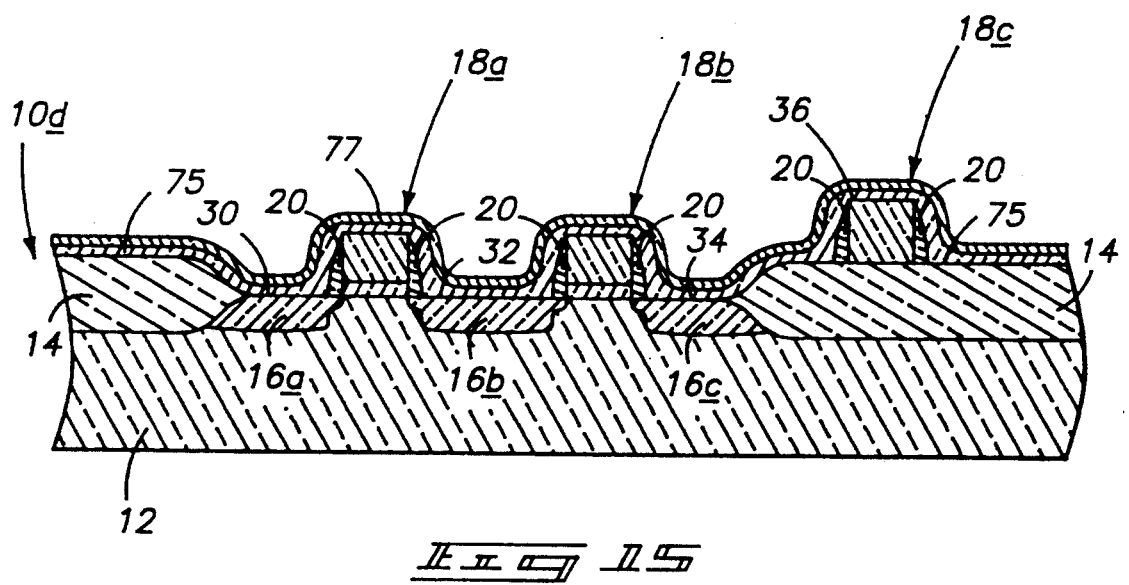
FIG. 15 is a diagrammatic section of the FIG. 14 wafer illustrated at a processing step subsequent to that illustrated by FIG. 14.

Referring to FIG. 15, a transition metal layer 77 is applied atop dielectric layer 75. Thereafter, layer 77 is subjected to an oxidizing atmosphere under oxidizing conditions to transform layer 77 into a transition metal oxide. During such step, dielectric barrier layer 75 shields contact of layer 77 from underlying areas of silicon thereby preventing formation of a silicide. Such might be desirable in certain applications which are beyond the scope of this disclosure to prevent silicon consumption. Note that where the transition metal oxide is applied directly onto the wafer, dielectric layer 75 will not typically be needed as no transition metal elements are available for silicidation. Dielectric layer 75 preferably comprises SiO$_2$, while the transition metal oxide preferably comprises titanium oxide. The transition metal oxide layer preferably has a thickness of from 200 to about 4000 Angstroms.

From FIG. 15, the process would proceed as described generally above, with the transition metal oxide being utilized as an effective etch stop when etching an overlying dielectric layer to adjacent desired regions at different elevations.

In compliance with the statute, the invention has been described in language more or less specific as to structural and methodical features. It is to be understood, however, that the invention is not limited to the specific features shown and described, since the means and construction herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of processing a semiconductor wafer comprising the following steps:
   fabricating a wafer to define a plurality of conductively doped silicon containing active regions, the active regions having outwardly exposed surfaces positioned at varying elevations on the wafer;
   depositing a layer of transition metal atop the wafer which contacts the surfaces of the active regions and other areas on the wafer; the transition metal layer having a thickness, an outer region and an inner region;
   processing the wafer under conditions which reacts a) the transition metal of the inner region over the silicon containing active regions with such silicon to produce a transition metal silicide, and b) the transition metal of the outer region to form a transition metal oxide thereby transforming the outer region over the other areas into transition metal oxide and the transition metal over the silicon containing active regions into sandwich regions of outer transition metal oxide and adjacent transition metal silicide in contact with the active regions; the outer transition metal oxide regions of the sandwich regions having outer surfaces positioned at varying elevations on the wafer;
   applying an insulating dielectric layer atop the wafer;
   selectively etching the insulating dielectric layer over selected portions of different elevation sandwich regions using an etch chemistry which is highly selective to the transition metal oxide and using the transition metal oxide as an effective etch in etching of the insulating dielectric layer in a single etch step to selected outer surfaces of the sandwich regions which are at different elevations; and
   etching the transition metal oxide from the selected portions of outer transition metal sandwich regions.

2. The method of processing a semiconductor wafer of claim 1 wherein the transition metal is selected from the group consisting of Ti, Mo, Ta, Co, Pt, Pd, Ni and W, or alloys thereof.

3. The method of processing a semiconductor wafer of claim 1 wherein the transition metal is applied to a thickness of from about 200 Angstroms to about 600 Angstroms.

4. The method of processing a semiconductor wafer of claim 3 wherein the transition metal is applied to a thickness of about 300 Angstroms.

5. The method of processing a semiconductor wafer of claim 1 wherein,
   the transition metal is selected from the group consisting of Ti, Mo, Ta, Co, Pt, Pd, Ni and W, or alloys thereof; and
   the transition metal is applied to a thickness of from about 200 Angstroms to about 600 Angstroms.

6. The method of processing a semiconductor wafer of claim 1 wherein the step of processing the wafer comprises heating the wafer in an oxidizing atmosphere containing oxygen.

7. The method of processing a semiconductor wafer of claim 6 wherein the step of processing the wafer comprises rapid thermal processing.

8. The method of processing a semiconductor wafer of claim 1 wherein the plurality of conductively doped active regions comprises sources and drains of field effect transistors, the field effect transistors having gates; the method further comprising depositing an insulating dielectric layer atop the wafer over the field effect transistor gates before deposition of the transition metal, the insulating dielectric deposited over the field effect transistor gates being selected such the transition metal oxide is selectively etchable relative to such insulating dielectric, and wherein the step of etching the transition metal oxide comprises etching the transition metal oxide with a chemistry which is selective relative to the insulating dielectric deposited over the field effect transistor gates.

9. A method of processing a semiconductor wafer comprising the following steps:
   fabricating a wafer to define a plurality of conductively doped silicon containing active regions, the active regions having outwardly exposed surfaces positioned at varying elevations on the wafer;
   depositing a layer of elemental titanium metal atop the wafer which contacts the surfaces of the active regions and other areas on the wafer; the titanium layer having a thickness, an outer region and an inner region;

processing the wafer under conditions which reacts a) the titanium of the inner region over the silicon containing active regions with such silicon to produce a titanium silicide comprising a formula $TiSi_x$, where "x" is from about 1.0 to 2.5, and b) the titanium of the outer region to form a titanium oxide comprising a formula $TiO_y$, where "y" is from about 1.0 to 2.0 thereby transforming the outer region over the other areas into $TiO_y$ and the titanium over the silicon containing active regions into sandwich regions of outer $TiO_y$ and adjacent $TiSi_x$ in contact with the active regions; the outer $TiO_y$ regions of the sandwich regions having outer surfaces positioned at varying elevations on the wafer;

applying an insulating dielectric layer atop the wafer;

selectively etching the insulating dielectric layer over selected portions of different elevation sandwich regions using an etch chemistry which is highly selective to the $TiO_y$ and using the $TiO_y$ as an effective etch stop in etching of the insulating dielectric layer in a single etch step to selected outer surfaces of the sandwich regions which are at different elevations; and etching the $TiO_y$ from the selected portions of outer regions of the sandwich regions.

10. The method of processing a semiconductor wafer of claim 9 wherein the titanium is applied to a thickness of from about 200 Angstroms to about 600 Angstroms.

11. The method of processing a semiconductor wafer of claim 10 wherein the titanium is applied to a thickness of about 300 Angstroms.

12. The method of processing a semiconductor wafer of claim 9 wherein the step of processing the wafer comprises heating the wafer in an oxidizing atmosphere containing oxygen.

13. The method of processing a semiconductor wafer of claim 9 wherein the step of processing the wafer comprises rapid thermal processing.

14. The method of processing a semiconductor wafer of claim 9 wherein the step of selectively etching the insulating dielectric is conducted with an etchant gas chemistry comprising $CHF_3$, Ar, and $CF_4$.

15. The method of processing a semiconductor wafer of claim 9 further comprising etching the $TiO_y$ from the selected portions of outer regions of the sandwich regions with a solution of $NH_4OH$ or $H_2SO_4$.

16. The method of processing a semiconductor wafer of claim 9 wherein, the step of selectively etching the insulating dielectric is conducted with an etchant gas chemistry comprising $CHF_3$, Ar, and $CF_4$; and further comprising:

etching the $TiO_y$ from the selected portions of outer regions of the sandwich regions with a solution of $NH_4OH$ or $H_2SO_4$.

17. The method of processing a semiconductor wafer of claim 16 wherein the titanium is applied to a thickness of from about 200 Angstroms to about 600 Angstroms.

18. The method of processing a semiconductor wafer of claim 16 wherein the step of processing the wafer comprises heating the wafer in an oxidizing atmosphere containing oxygen.

19. The method of processing a semiconductor wafer of claim 9 wherein the plurality of conductively doped active regions comprises sources and drains of field effect transistors, the field effect transistors having gates; the method further comprising depositing an insulating dielectric layer atop the wafer over the field effect transistor gates before deposition of the $TiO_y$, the insulating dielectric deposited over the field effect transistor gates being selected such the $TiO_y$ is selectively etchable relative to such insulating dielectric, and wherein the step of etching the $TiO_y$ comprises etching the $TiO_y$ with a chemistry which is selective relative to the insulating dielectric deposited over the field effect transistor gates.

20. A method of processing a semiconductor wafer comprising the following steps:

fabricating a wafer to define a plurality of conductively doped silicon containing active regions, the active regions having outwardly exposed surfaces positioned at varying elevations on the wafer;

converting the outwardly exposed surfaces of the active regions into a barrier transition metal silicide which connects with the active regions;

providing a layer of transition metal oxide over the barrier transition metal silicide of the active regions thereby producing sandwich regions of outer transition metal oxide regions and adjacent transition metal silicide in contact with the active regions; the outer transition metal oxide regions of the sandwich regions having outer surfaces positioned at varying elevations on the wafer;

applying an insulating dielectric layer atop the wafer;

selectively etching the insulating dielectric layer over selected portions of different elevation sandwich regions using an etch chemistry which is highly selective to the transition metal oxide and using the transition metal oxide as an effective etch stop in etching of the insulating dielectric layer in a single etch step to adjacent selected active regions which are at different elevations; and etching the transition metal oxide from the selected portions of outer transition metal sandwich regions.

21. The method of processing a semiconductor wafer of claim 20 wherein the transition metal of the barrier metal silicide and the transition metal of the transition metal oxide are selected from the group consisting of Ti, Mo, Ta, Co, Pt, Pd, Ni, and W, or alloys thereof.

22. The method of processing a semiconductor wafer of claim 20 wherein the transition metal of the barrier metal silicide comprises titanium.

23. The method of processing a semiconductor wafer of claim 20 wherein the transition metal of the transition metal oxide comprises titanium.

24. The method of processing a semiconductor wafer of claim 20 wherein the transition metal of the barrier metal silicide and the transition metal of the transition metal oxide consists essentially of titanium.

25. The method of processing a semiconductor wafer of claim 20 wherein the step of converting comprises:

depositing a layer of transition metal atop the wafer over the outwardly exposed active region surfaces;

heating the wafer to react the transition metal over the outwardly exposed active regions with the underlying silicon to produce the transition metal silicide;

etching unreacted transition metal from the wafer;

and wherein the step of providing a layer of transition metal oxide over the barrier transition metal silicide comprises depositing a layer transition metal oxide.

26. The method of processing a semiconductor wafer of claim 25 wherein the transition metal of the barrier metal silicide and the transition metal of the transition metal oxide are selected from the group consisting of Ti, Mo, Ta, Co, Pt, Pd, Ni and W, or alloys thereof.

27. The method of processing a semiconductor wafer of claim 25 wherein the transition metal of the barrier metal silicide comprises titanium.

28. The method of processing a semiconductor wafer of claim 25 wherein the transition metal of the transition metal oxide comprises titanium.

29. The method processing a semiconductor wafer of claim 25 wherein the transition metal of the barrier metal silicide and the transition metal of the transition metal oxide consists essentially of titanium.

30. The method of processing a semiconductor wafer of claim 20 wherein the plurality of conductively doped active regions comprises sources and drains of field effect transistors, the field effect transistors having gates; the method further comprising depositing an insulating dielectric layer atop the wafer over the field effect transistor gates before deposition of the transition metal oxide, the insulating dielectric deposited over the field effect transistor gates being selected such the transition metal oxide is selectively etchable relative to such insulating dielectric, and wherein the step of etching the transition metal oxide comprises etching the transition metal oxide with a chemistry which is selective relative to the insulating dielectric deposited over the field effect transistor gates.

31. A method of processing a semiconductor wafer comprising the following steps:
fabricating a wafer to define a plurality of conductively doped active regions, the active regions having outwardly exposed surfaces positioned at varying elevations on the wafer:
providing a layer of transition metal oxide elevationally above the active regions:
providing a barrier layer of insulating dielectric atop the wafer and over the active regions before providing the layer of transition metal oxide atop the wafer;
applying an insulating dielectric layer elevationally above the transition metal oxide layer;
etching selected portions of the insulating dielectric layer over different elevation active areas using an etch chemistry which is highly selective to the transition metal oxide and using the transition metal oxide as an effective etch stop enabling etching of the insulating dielectric layer in a single etch step to adjacent selected active regions which are at different elevations; and
etching the transition metal oxide from the selected portions and upwardly exposing selected active regions.

32. The method of processing a semiconductor wafer of claim 31 wherein the insulating dielectric barrier layer is provided to a thickness of at least 500 Angstroms.

33. The method of processing a semiconductor wafer of claim 31 wherein the barrier layer of insulating dielectric is provided to a thickness of at least 500 Angstroms; and wherein,
the transition metal oxide is provided to a thickness of from about 200 Angstroms to about 4000 Angstroms.

34. A method of processing a semiconductor wafer comprising the following steps:
fabricating a wafer to define a plurality of conductively doped active regions, the active regions having outwardly exposed surfaces positioned at varying elevations on the wafer:
providing a layer of transition metal oxide comprising a titanium oxide comprising a formula $TiO_y$, where "y" is from about 1.0 to 2.0 elevationally above the active regions:
providing a barrier layer of insulating dielectric atop the wafer and over the active regions before providing the layer of transition metal oxide atop the wafer;
applying an insulating dielectric layer elevationally above the transition metal oxide layer;
etching selected portions of the insulating dielectric layer over different elevation active areas using an etch chemistry which is highly selective to the transition metal oxide and using the transition metal oxide as an effective etch stop enabling etching of the insulating dielectric layer in a single etch step to adjacent selected active regions which are at different elevations; and
etching the transition metal oxide from the selected portions and upwardly exposing selected active regions.

35. The method of processing a semiconductor wafer of claim 34 wherein the insulating dielectric barrier layer is provided to a thickness of at least 500 Angstroms.

36. The method of processing a semiconductor wafer of claim 34 wherein the barrier layer of insulating dielectric is provided to a thickness of at least 500 Angstroms or greater; and wherein,
the transition metal oxide is provided to a thickness of from about 200 Angstroms to about 4000 Angstroms.

* * * * *